US012581905B2

(12) United States Patent
Sunohara et al.

(10) Patent No.: US 12,581,905 B2
(45) Date of Patent: Mar. 17, 2026

(54) SUBSTRATE FIXING DEVICE

(71) Applicant: SHINKO ELECTRIC INDUSTRIES CO., LTD., Nagano (JP)

(72) Inventors: Masahiro Sunohara, Nagano (JP); Keita Sato, Nagano (JP); Hiroharu Yanagisawa, Nagano (JP); Riku Nishikawa, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 138 days.

(21) Appl. No.: 18/418,449

(22) Filed: Jan. 22, 2024

(65) Prior Publication Data

US 2024/0249966 A1 Jul. 25, 2024

(30) Foreign Application Priority Data

Jan. 24, 2023 (JP) ................................. 2023-008620

(51) Int. Cl.
*H01T 23/00* (2006.01)
*H01L 21/683* (2006.01)
*H01L 21/687* (2006.01)

(52) U.S. Cl.
CPC .... *H01L 21/6833* (2013.01); *H01L 21/68757* (2013.01); *H01L 21/68785* (2013.01)

(58) Field of Classification Search
None
See application file for complete search history.

(56) References Cited

U.S. PATENT DOCUMENTS

| | | | |
|---|---|---|---|
| 6,370,005 B1 * | 4/2002 | Sun | H02N 13/00 |
| | | | 361/234 |
| 2006/0158821 A1 * | 7/2006 | Miyashita | H01L 21/683 |
| | | | 361/233 |
| 2021/0175054 A1 | 6/2021 | Kusama | |

FOREIGN PATENT DOCUMENTS

| | | |
|---|---|---|
| JP | 4286568 B2 | 7/2009 |
| JP | 2021-093436 A | 6/2021 |

* cited by examiner

*Primary Examiner* — Stephen W Jackson
(74) *Attorney, Agent, or Firm* — Rankin, Hill & Clark LLP

(57) ABSTRACT

A substrate fixing device includes a base plate having a first surface in which a plurality of first bottomed holes are formed, an electrostatic chuck mounted on the first surface of the base plate and having a second surface facing the first surface, the second surface being formed therein with a plurality of second bottomed holes each connected to each of the first bottomed holes, and a plurality of fixing members each fit into one first bottomed hole and one second bottomed hole.

4 Claims, 6 Drawing Sheets

SUBSTRATE FIXING DEVICE

CROSS-REFERENCE TO RELATED APPLICATIONS

This application claims priority from Japanese Patent Application No. 2023-008620 filed on Jan. 24, 2023, the contents of which are incorporated herein by reference.

TECHNICAL FIELD

The present disclosure relates to a substrate fixing device.

BACKGROUND ART

In the related art, a film formation apparatus and a plasma etching apparatus that are used when manufacturing a semiconductor device each have a stage for accurately holding a wafer in a vacuum treatment chamber. As such a stage, for example, a substrate fixing device configured to suck and hold a wafer by an electrostatic chuck mounted on a base plate is suggested.

An example of the substrate fixing device may have a structure in which a gas supply part for cooling a wafer is provided. The gas supply part supplies a gas to a surface of the electrostatic chuck via a gas flow path provided in the base plate and a gas hole provided in the electrostatic chuck (for example, refer to Patent Literature 1).

CITATION LIST

Patent Literature

Patent Literature 1: JP2021-093436A
Patent Literature 2: Japanese Patent No. 4286568B

SUMMARY OF INVENTION

In the substrate fixing device of the related art, a temperature uniformity of a placement surface on which a suction target object is placed may decrease. The decrease in temperature uniformity may lead to non-uniformity in an etching rate.

The present disclosure is to provide a substrate fixing device that can suppress a decrease in temperature uniformity of a placement surface on which a suction target object is placed.

Certain embodiment provides a substrate fixing device comprising:

a base plate having a first surface in which a plurality of first bottomed holes are formed;

an electrostatic chuck mounted on the first surface of the base plate and having a second surface facing the first surface, the second surface being formed therein with a plurality of second bottomed holes each connected to each of the first bottomed holes; and a plurality of fixing members each fit into one first bottomed hole and one second bottomed hole.

According to the present disclosure, it is possible to suppress a decrease in temperature uniformity of the placement surface on which the suction target object is placed.

DESCRIPTION OF EMBODIMENTS

The present inventors conducted intensive studies in order to determine a cause of a decrease in temperature uniformity of a placement surface of an electrostatic chuck on which a suction target object is placed in a substrate fixing device of the related art. As a result, it was found that positional misalignment in an in-plane direction occurs between a base plate and the electrostatic chuck in some cases. If the positional misalignment occurs, the uniformity of a cooling gas flow rate decreases and the temperature uniformity decreases. In addition, if the positional misalignment occurs, an adhesive layer that bonds the base plate and the electrostatic chuck is likely to block a path of gas, so the temperature uniformity is likely to decrease. Additionally, the substrate fixing device is used with a ring-shaped member called an edge ring or focus ring being attached. In this case, it was also found that if the positional misalignment occurs, the ring-shaped member cannot be attached in some cases. Based on these findings, the inventors of the present application conceived the following embodiments.

Hereinafter, the embodiments will be described with reference to the accompanying drawings. Note that, for convenience, in the accompanying drawings, a characteristic part is enlarged so as to easily understand the feature, and it cannot be said that the dimension ratios and the like of the respective constitutional elements are the same as those of the actual elements. In addition, in the respective drawings, the parts having the same configurations are denoted with the same reference signs, and the overlapping descriptions may be omitted.

Configuration of Substrate Fixing Device

Figure 1:
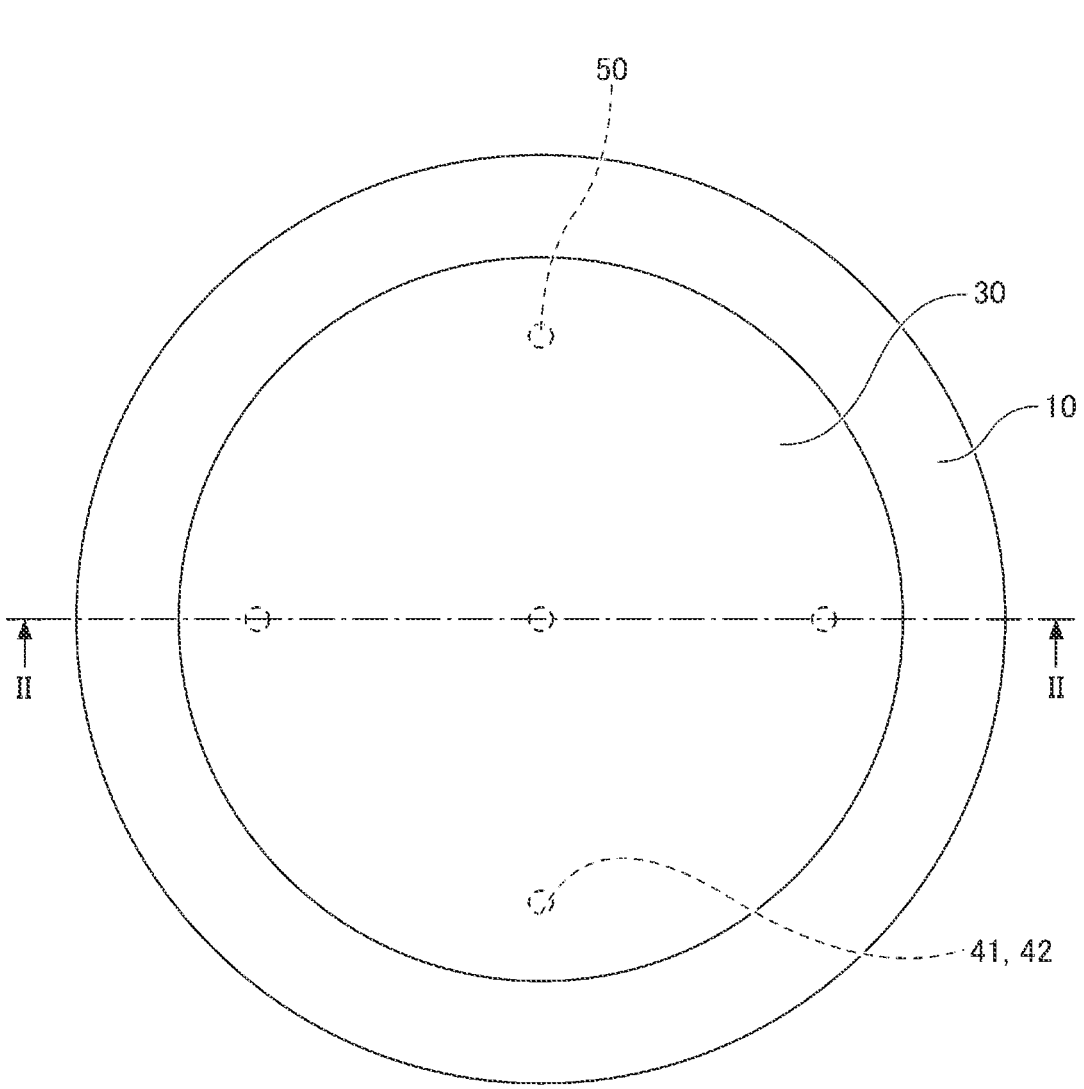
FIG. 1 is a plan view simplifying and exemplifying a substrate fixing device according to an embodiment.
Figure 2:
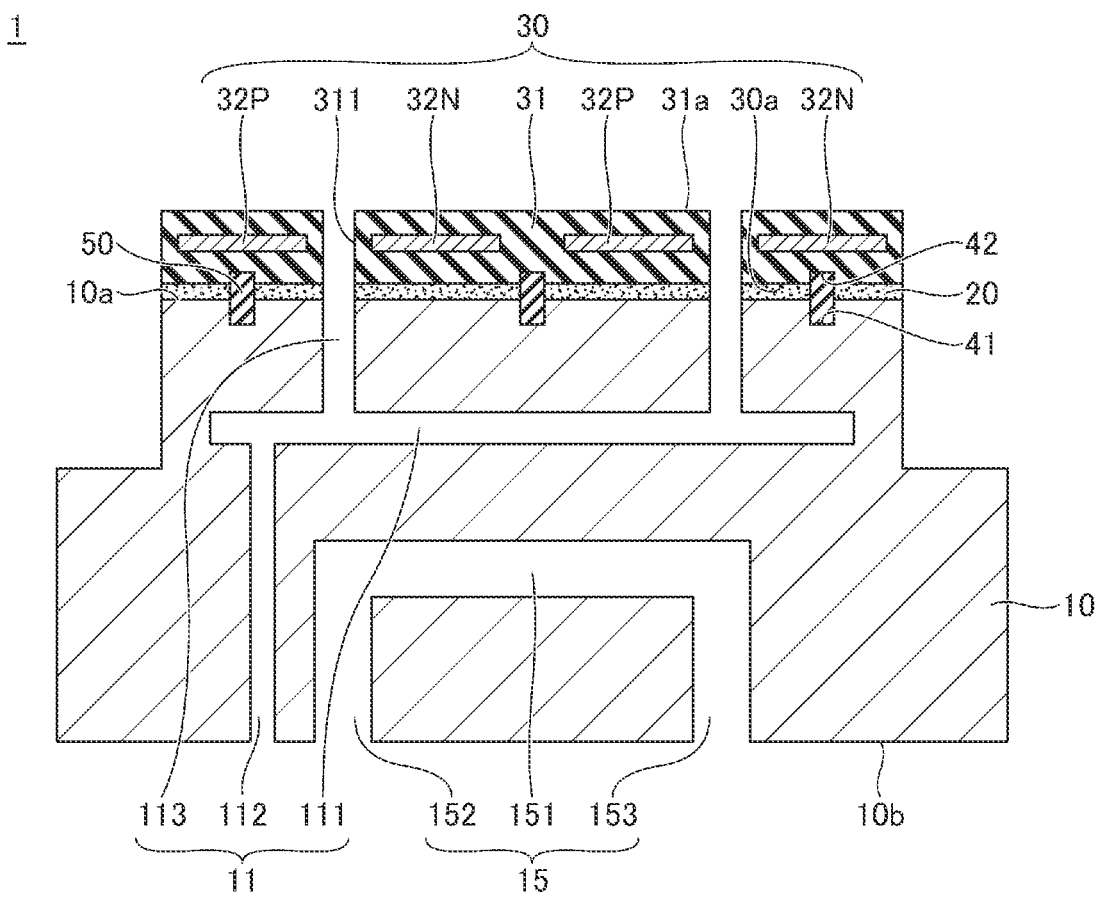
FIG. 2 is a cross-sectional view simplifying and exemplifying the substrate fixing device according to the embodiment.

First, a configuration of a substrate fixing device according to an embodiment will be described. FIG. 1 is a plan view simplifying and exemplifying a substrate fixing device according to an embodiment. FIG. 2 is a cross-sectional view simplifying and exemplifying the substrate fixing device according to the embodiment. FIG. 2 corresponds to a cross-sectional view taken along a line II-II in FIG. 1.

Referring to FIGS. 1 and 2, a substrate fixing device 1 includes, main constitutional elements, a base plate 10, an adhesive layer 20, an electrostatic chuck 30, and a plurality of fixing pins 50. The substrate fixing device 1 is a device that sucks and holds a substrate (a wafer or the like), which is a suction target object, by the electrostatic chuck 30 mounted on one surface of the base plate 10.

The base plate 10 is a member for mounting the electrostatic chuck 30. A thickness of the base plate 10 is, for example, about 20 mm to 40 mm. The base plate 10 is formed of, for example, aluminum, and can be used as an electrode or the like for controlling plasma. By supplying predetermined high-frequency electric power to the base plate 10, the energy for causing ions and the like in a generated plasma state to collide with the substrate sucked on the electrostatic chuck 30 can be controlled to effectively perform etching processing.

In the base plate 10, a gas supply part 11 is provided. The gas supply part 11 includes a gas flow path 111, a gas injection portion 112, and gas discharge portions 113.

The gas flow path 111 is, for example, a hole formed in an annular shape in the base plate 10. The gas injection portion 112 is a hole whose one end communicates with the gas flow path 111 and whose other end is exposed to the outside from a lower surface 10*b* of the base plate 10, and is provided to introduce an inert gas (for example, He, Ar, or the like) for cooling the substrate sucked on the electrostatic chuck 111 from the outside of the substrate fixing device 1. The gas discharge portion 113 is a hole whose one end communicates with the gas flow path 111 and whose other end is exposed to the outside from an upper surface 10*a* of the base plate 10 and which penetrates through the adhesive layer 20, and is provided to discharge the inert gas introduced into the gas flow path 111. The gas discharge portions 113 are scattered in the upper surface 10*a* of the base plate 10 in a plan view. The number of gas discharge portions 113 can be determined as appropriate, as necessary, but is about several tens to several hundreds, for example.

Note that the description 'in a plan view' indicates that a target object is seen from a normal direction of the upper surface 10*a* of the base plate 10, and the description 'planar shape' indicates a shape of the target object as seen from the normal direction of the upper surface 10*a* of the base plate 10.

In the base plate 10, a cooling mechanism 15 may also be provided. The cooling mechanism 15 includes a coolant flow path 151, a coolant introduction portion 152, and a coolant discharge portion 153. The coolant flow path 151 is, for example, a hole formed in an annular shape in the base plate 10. The coolant introduction portion 152 is a hole whose one end communicates with the coolant flow path 151 and whose other end is exposed to the outside from the lower surface 10*b* of the base plate 10, and is provided to introduce a coolant (for example, cooling water, Galden, or the like) into the coolant flow path 151 from the outside of the substrate fixing device 1. The coolant discharge portion 153 is a hole whose one end communicates with the coolant flow path 151 and whose other end is exposed to the outside from the lower surface 10*b* of the base plate 10, and is provided to discharge the coolant introduced into the coolant flow path 151.

The cooling mechanism 15 is connected to a coolant control device (not shown) provided outside of the substrate fixing device 1. The coolant control device (not shown) introduces a coolant from the coolant introduction portion 152 into the coolant flow path 151, and discharges the coolant from the coolant discharge portion 153. The coolant is caused to circulate in the cooling mechanism 15 to cool the base plate 10, so that it is possible to cool the wafer sucked on the electrostatic chuck 30.

The electrostatic chuck 30 is a part that sucks and holds a wafer that is a suction target object. A planar shape of the electrostatic chuck 30 is circular, for example. A diameter of the wafer that is a suction target object of the electrostatic chuck 30 is, for example, 8 inches, 12 inches or 18 inches.

The electrostatic chuck 30 is provided on upper surface 10*a* of the base plate 10 via the adhesive layer 20. A material of the adhesive layer 20 is, for example, a silicone-based adhesive. A thickness of the adhesive layer 20 is, for example, about 0.1 mm to 1.5 mm. The adhesive layer 20 bonds the base plate 10 and the electrostatic chuck 30, and has an effect of reducing stress that is generated due to a difference in thermal expansion coefficient between the electrostatic chuck 30 made of ceramics and the base plate 10 made of aluminum.

The electrostatic chuck 30 has a base body 31, positive electrodes 32P and negative electrodes 32N. An upper surface of the base body 31 is a placement surface 31*a* on which a suction target object is placed. The electrostatic chuck 30 is, for example, a Johnsen-Rahbeck type electrostatic chuck. However, the electrostatic chuck 30 may also be a Coulomb force type electrostatic chuck.

The base body 31 is a dielectric body. As the base body 31, for example, a ceramic such as aluminum oxide ($Al_2O_3$) and aluminum nitride (AlN) is used. A thickness of the base body 31 is, for example, about 1 mm to 6 mm, and a relative permittivity (kHz) of the base body 31 is, for example, about 9 to 10.

The positive electrodes 32P and the negative electrodes 32N are bipolar electrostatic electrodes formed of thin films, and are embedded in the base body 31. The positive electrodes 32P and the negative electrodes 32N are formed in, for example, a comb teeth-shaped electrode pattern, and teeth of each electrode are alternately arranged side by side at predetermined intervals. The positive electrodes 32P and the negative electrodes 32N are connected to a power supply provided outside of the substrate fixing device 1, and generate a suction force by static electricity between the electrodes and the wafer when a predetermined voltage is applied from the power supply. Thereby, it is possible to suck and hold the wafer on the placement surface 31*a* of the base body 31 of the electrostatic chuck 30. When a higher voltage is applied between the positive electrode 32P and the negative electrode 32N, a suction holding force becomes stronger. As materials of the positive electrode 32P and the negative electrode 32N, tungsten, molybdenum and the like are used, for example.

In the base body 31, a heating element (heater) that generates heat when a voltage is applied from the outside of the substrate fixing device 1 and heats the placement surface 31*a* of the base body 31 to a predetermined temperature may also be provided.

Gas holes 311 formed to penetrate the base body 31 and to expose the other ends of the gas discharge portions 113 are provided at positions corresponding to the respective gas discharge portions 113 of the base body 31. A planar shape of the gas hole 311 is, for example, a circular shape having an inner diameter of about 0.1 mm to 1 mm. The gas holes 311 can be formed by drilling or laser processing, for example. The inert gas is supplied to a rear surface of the suction target object sucked on the electrostatic chuck 30 through the gas holes 311, so that the suction target object is cooled.

A plurality of first bottomed holes 41 are formed in the upper surface 10*a* of the base plate 10. A planar shape of the first bottomed hole 41 is, for example, circular. The number of first bottomed holes 41 can be determined as appropriate, as necessary, but is about 2 to 30, for example. For example, a diameter of the first bottomed hole 41 is about 1 mm to 5 mm, and a depth of the first bottomed hole 41 is about 3 mm to 5 mm. The upper surface 10*a* of the base plate 10 is an example of the first surface.

A plurality of second bottomed holes 42 are formed in a lower surface 30*a* of the electrostatic chuck 30. The lower surface 30*a* of the electrostatic chuck 30 faces the upper surface 10a of the base plate 10. A planar shape of the second bottomed hole 42 is, for example, circular. The number of second bottomed holes 42 is the same as the number of first bottomed holes 41. For example, a diameter of the second bottomed hole 42 is about 1 mm to 5 mm, and a depth of the second bottomed hole 42 is about 0.5 mm to 1.5 mm. For example, the diameter of the second bottomed hole 42 is the same as the diameter of the first bottomed hole 41, and the depth of the second bottomed hole 42 is smaller than the depth of the first bottomed hole 41. By making the depth of the first bottomed hole 41 deeper, the fixing pins 50 is difficult to fall off from the first bottomed hole 41. The lower surface 30a of the electrostatic chuck 30 is an example of the second surface.

Each of the plurality of fixing pins 50 is fit into one first bottomed hole 41 and one second bottomed hole 42. The fixing pin 50 has a cylindrical three-dimensional shape, for example. A height of the fixing pin 50 is the same as a sum of the depth of the first bottomed hole 41, the thickness of the adhesive layer 20, and the depth of the second bottomed hole 42. A material of the fixing pin 50 is, for example, ceramic, metal, or resin. Ceramic is excellent in terms of insulation property, processing precision, and heat resistance. Metal is excellent in terms of processing precision and heat resistance. Examples of metal include aluminum and stainless steel. Resin is excellent in terms of material cost. The fixing pin 50 is an example of the fixing member.

Manufacturing Method of Substrate Fixing Device

Figure 3:
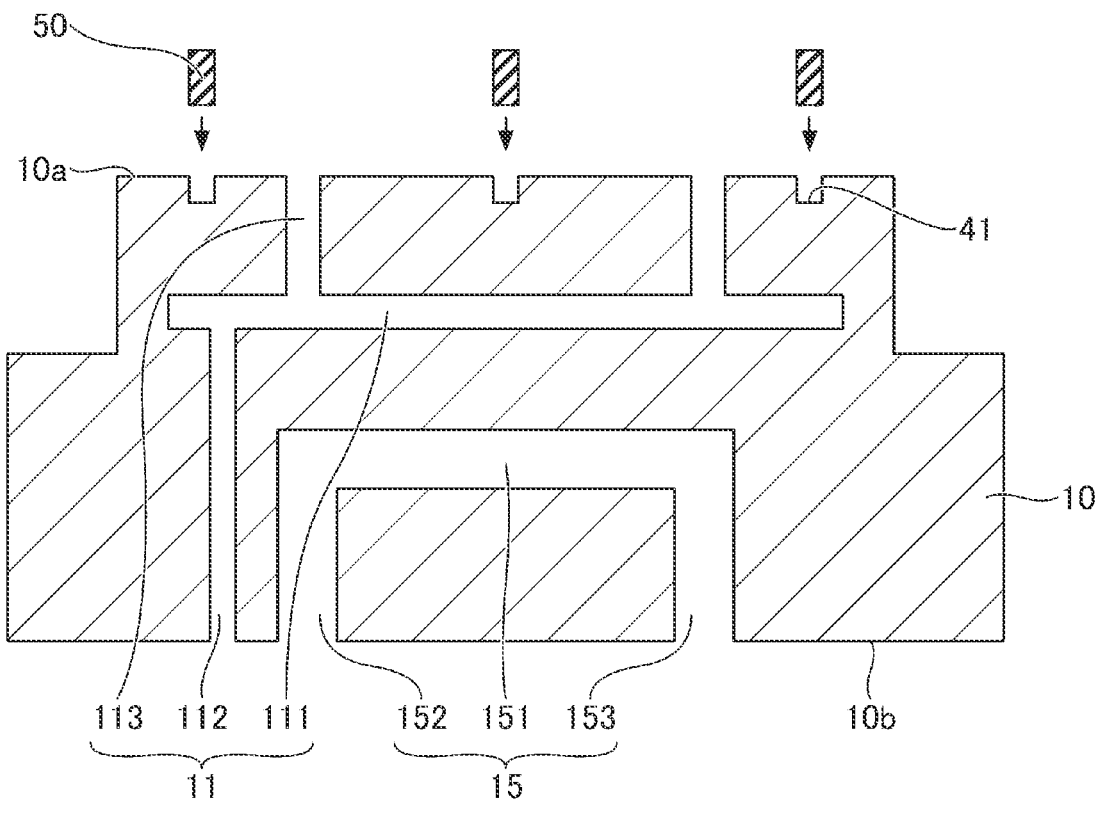
FIG. 3 is a cross-sectional view simplifying and exemplifying a manufacturing method of a substrate fixing device according to an embodiment.
Figure 4:
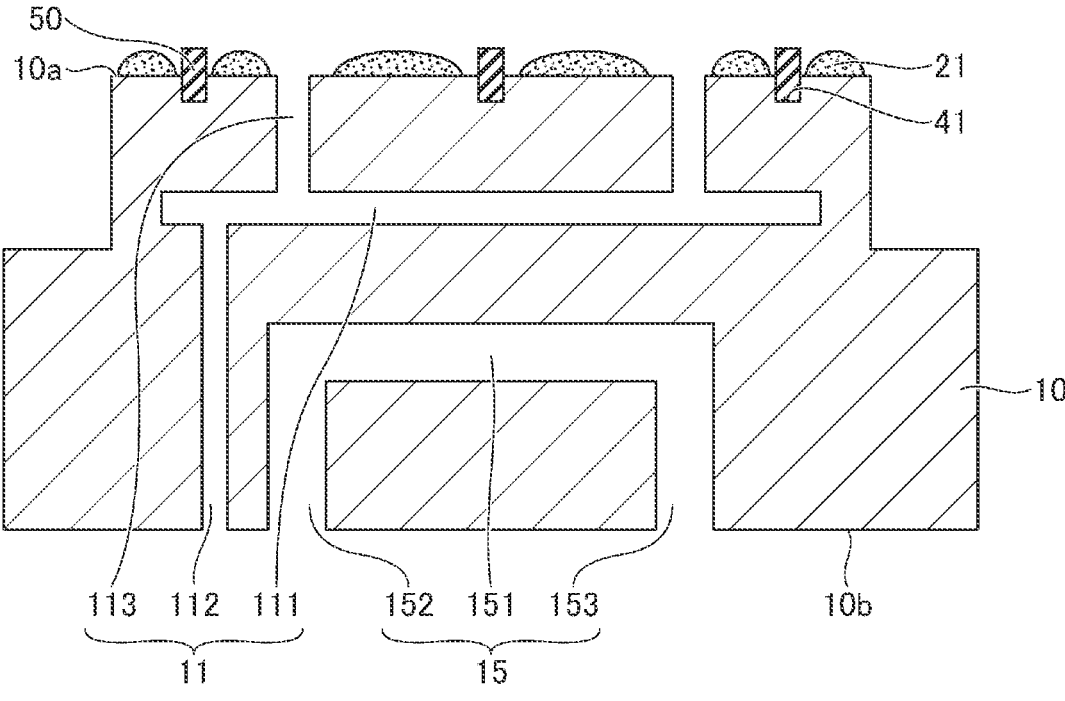
FIG. 4 is a cross-sectional view simplifying and exemplifying the manufacturing method of a substrate fixing device according to the embodiment.
Figure 5:
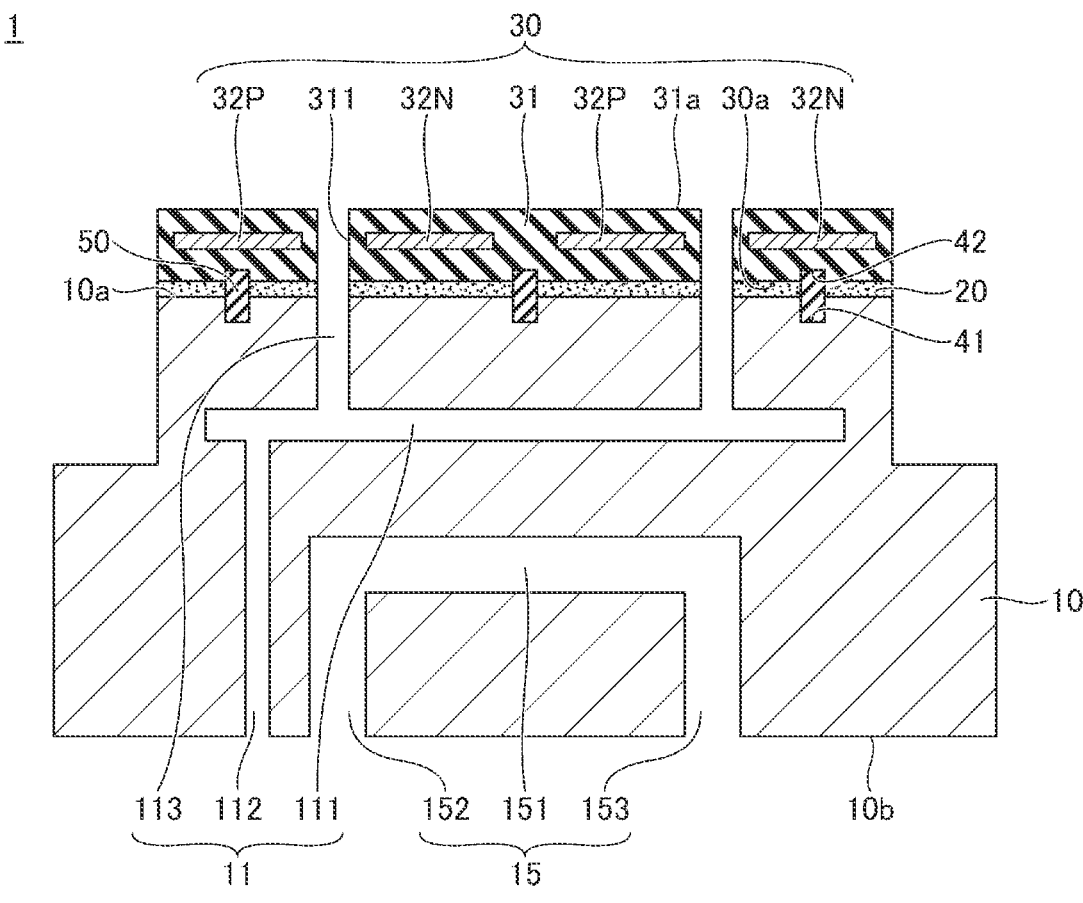
FIG. 5 is a cross-sectional view simplifying and exemplifying the manufacturing method of a substrate fixing device according to the embodiment.

Next, a manufacturing method of the substrate fixing device 1 according to an embodiment is described. FIGS. 3 to 5 are cross-sectional views simplifying and exemplifying a manufacturing method of a substrate fixing device according to an embodiment.

First, as shown in FIG. 3, a base plate 10 is prepared in which a plurality of first bottomed holes 41 are formed in an upper surface 10a. The first bottomed holes 41 can be formed by drilling, for example. Next, fixing pins are fit into the first bottomed holes 41 one by one.

Then, as shown in FIG. 4, an adhesive 21 that is to be an adhesive layer 20 is applied to the upper surface 10a of the base plate 10.

In addition, as shown in FIG. 5, an electrostatic chuck 30 is prepared in which a plurality of second bottomed holes 42 are formed in a lower surface 30a. The second bottomed holes 42 can be formed by drilling, for example. Then, the electrostatic chuck 30 is pressed against the base plate 10 with the adhesive 21 sandwiched therebetween while inserting the fixing pins 50 into the second bottomed holes 42. Subsequently, the adhesive 21 is cured to form an adhesive layer 20. That is, the base plate 10 and the electrostatic chuck 30 are bonded together.

In this way, the substrate fixing device 1 according to the embodiment can be manufactured.

According to the substrate holding device 1 of the embodiment, the base plate 10 and the electrostatic chuck 30 are restrained each other in an in-plane direction (direction parallel to the upper surface 10a and the lower surface 30a) by the fixing pins 50. Therefore, positional deviation of the base plate 10 and the electrostatic chuck 30 in the in-plane direction is suppressed. For this reason, the positioning accuracy between the gas discharge portion 113 and the gas hole 311 is high, the adhesive layer 20 is difficult to block the gas discharge portion 113 and the gas hole 311, and a decrease in temperature uniformity of the placement surface 31a on which the suction target object is placed can be suppressed. In addition, the ring-shaped member can be stably attached to the substrate fixing device 1.

Additionally, the fixing pin 50 also functions as a spacer between the base plate 10 and the electrostatic chuck 30. For this reason, the uniformity of a distance between the base plate 10 and the electrostatic chuck 30 can be maintained at a high level. The distance between the base plate 10 and the electrostatic chuck 30 corresponds to the thickness of the adhesive layer 20. Non-uniformity in thickness of the adhesive layer 20 leads to non-uniformity in thermal conductivity between the base plate 10 and the electrostatic chuck 30. However, according to the present embodiment, the uniformity of thermal conductivity can be maintained at a high level, and in this respect as well, the decrease in temperature uniformity of the placement surface 31a on which the suction target object is placed can be suppressed.

Figure 6:
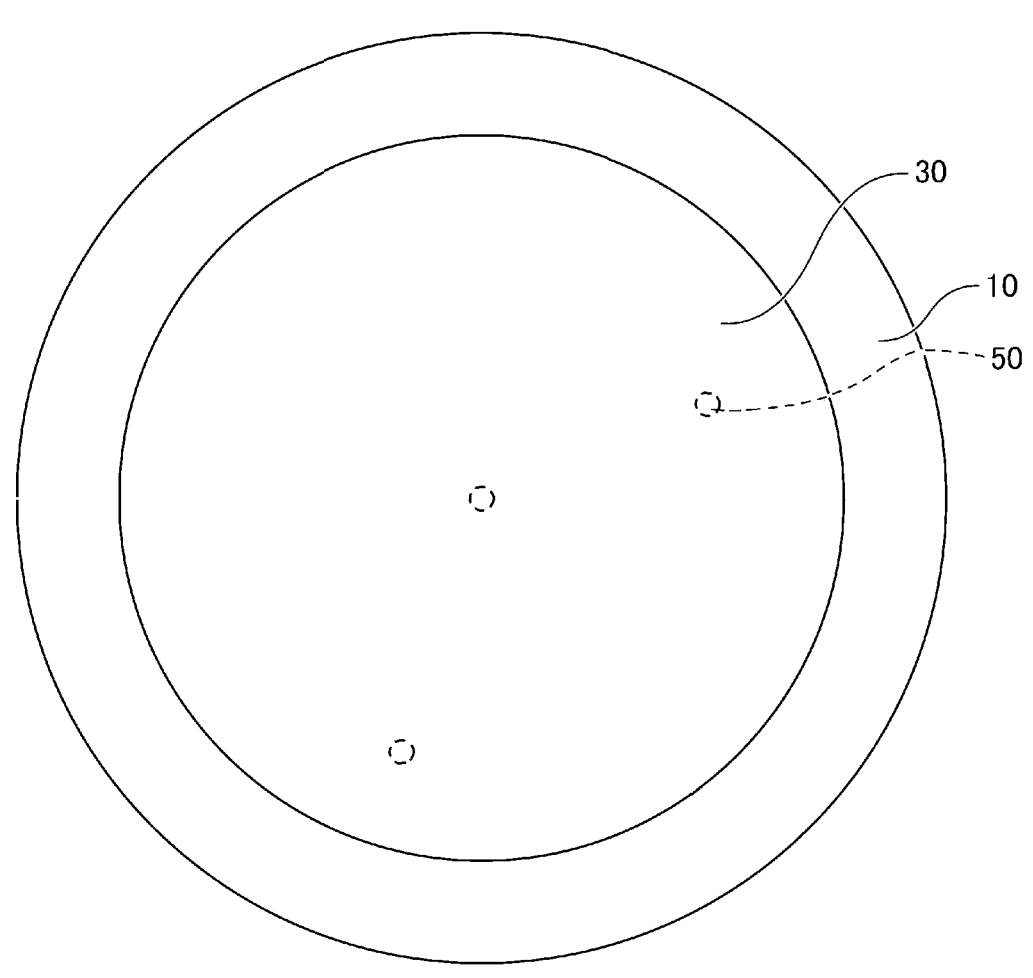
FIG. 6 is a plan view simplifying and exemplifying a modified substrate fixing device according to an embodiment.

It is preferable that the depths among the plurality of first bottomed holes 41 are the same, the depths among the plurality of second bottomed holes 42 are the same, and the heights among the plurality of fixing pins 50 are the same. In this specification, the term "the same depth" or "the same height" includes not only the same depth or the same height, but also a range of ±5 to 10 microns from the same depth or the same height. This is because it is easy to suppress non-uniformity in thermal conductivity between the base plate 10 and the electrostatic chuck 30. In addition, the numbers of first bottomed holes 41, second bottomed holes 42, and fixing pins 50 are three or more, respectively, and as shown in FIG. 6, it is preferable that the three or more first bottomed holes 41, second bottomed holes 42 and fixing pins 50 are not on the same line. This is to maintain high uniformity of the distance between the base plate 10 and the electrostatic chuck 30. The depth of the second bottomed hole 42 may be the same as the depth of the first bottomed hole 41.

Note that when manufacturing the substrate fixing device 1, the adhesive 21 may be applied to the upper surface 10a of the base plate 10 before inserting the fixing pins 50 into the first bottomed holes 41. Then, the fixing pins 50 are fit into the first bottomed holes 41, and then the base plate 10 and the electrostatic chuck 30 are bonded together.

In addition, when manufacturing the substrate fixing device 1, the fixing pins 50 may be fit into the second bottom holes 42 of the electrostatic chuck 30 by using an epoxy-based adhesive or a silicone-based adhesive, the adhesive 21 may be separately applied to the upper surface 10a of the base plate 10, and then the base plate 10 and the electrostatic chuck 30 may be bonded together.

Although the preferred embodiment has been described in detail, the present disclosure is not limited to the above-described embodiment, and a variety of changes and replacements can be made to the above-described embodiment without departing from the scope of the claims.

What is claimed is:

1. A substrate fixing device comprising:
a base plate having a first surface in which a plurality of first bottomed holes are formed;
an electrostatic chuck mounted on the first surface of the base plate and having a second surface facing the first surface, the second surface being formed therein with a plurality of second bottomed holes each connected to each of the first bottomed holes; and
a plurality of fixing members each fit into one first bottomed hole and one second bottomed hole,
wherein the plurality of first bottomed holes have the same depth, wherein the plurality of second bottomed holes have the same depth, and wherein the plurality of fixing members have the same height.

2. The substrate fixing device according to claim 1, wherein the first bottomed holes are deeper than the second bottomed holes.

3. The substrate fixing device according to claim 1, wherein numbers of the first bottomed holes, the second bottomed holes, and the fixing members are three or more, respectively, and wherein the three or more first bottomed holes, second bottomed holes and fixing members are not on a same line.

4. The substrate fixing device according to claim 1, wherein a material of the fixing members is ceramic, metal, or resin.

\* \* \* \* \*